(12) United States Patent
Drewery et al.

(10) Patent No.: US 11,676,798 B2
(45) Date of Patent: Jun. 13, 2023

(54) COOLING FOR A PLASMA-BASED REACTOR

(71) Applicant: Lam Research Corporation, Fremont, CA (US)

(72) Inventors: John Stephen Drewery, San Jose, CA (US); Neil Martin Paul Benjamin, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/601,911

(22) PCT Filed: Apr. 7, 2020

(86) PCT No.: PCT/US2020/027081
§ 371 (c)(1),
(2) Date: Oct. 6, 2021

(87) PCT Pub. No.: WO2020/210240
PCT Pub. Date: Oct. 15, 2020

(65) Prior Publication Data
US 2022/0139671 A1 May 5, 2022

Related U.S. Application Data (60) Provisional application No. 62/830,896, filed on Apr. 8, 2019.

(51) Int. Cl.
*H01J 37/32* (2006.01)
(52) U.S. Cl.
CPC ... *H01J 37/32119* (2013.01); *H01J 37/32522* (2013.01); *H01J 2237/002* (2013.01)

(58) Field of Classification Search
CPC .......... H01J 37/32119; H01J 37/32522; H01J 2237/002
See application file for complete search history.

(56) References Cited

U.S. PATENT DOCUMENTS 5,364,488 A * 11/1994 Minato ............. H01J 37/32522
118/724
5,525,159 A * 6/1996 Hama ................... C23C 16/466
118/723 R (Continued)

FOREIGN PATENT DOCUMENTS

| CN | 1561534 | 1/2005 |
| CN | 102084727 | 6/2011 |

(Continued)

OTHER PUBLICATIONS

International Application Serial No. PCT/US2020/027081, International Search Report dated Jul. 21, 2020, 4 pgs.

(Continued)

*Primary Examiner* — Yuechuan Yu
(74) *Attorney, Agent, or Firm* — Schwegman Lundberg & Woessner, P.A.

(57) ABSTRACT

In one embodiment, the disclosed apparatus is a heat-pipe cooling system that includes a conical structure having an upper portion that is truncated. The conical structure is configured to be formed above a dielectric window with the conical structure being configured to condense vapor from a heat-transfer fluid placed or formed within a volume formed between the dielectric window and the conical structure. At least one cooling coil is formed on an exterior portion of the conical structure. Other apparatuses and systems are disclosed.

13 Claims, 7 Drawing Sheets

(56) References Cited

U.S. PATENT DOCUMENTS

| | | | |
|---|---|---|---|
| 5,944,899 A * | 8/1999 | Guo | H01J 37/3244 156/345.33 |
| 2002/0104751 A1 * | 8/2002 | Drewery | C23C 14/35 204/298.18 |
| 2002/0185229 A1 | 12/2002 | Brcka et al. | |
| 2004/0084153 A1 * | 5/2004 | Fink | H01J 37/321 156/345.48 |
| 2013/0087283 A1 | 4/2013 | Mcchesney et al. | |
| 2015/0279634 A1 | 10/2015 | Pal et al. | |
| 2017/0103875 A1 | 4/2017 | Mcchesney et al. | |

FOREIGN PATENT DOCUMENTS

| | | |
|---|---|---|
| CN | 206329930 | 7/2017 |
| CN | 113661560 | 11/2021 |
| JP | 2003309109 A * | 10/2003 |
| JP | 2022526980 A | 5/2022 |
| KR | 2016004389 A | 4/2016 |

OTHER PUBLICATIONS

International Application Serial No. PCT/US2020/027081, Written Opinion dated Jul. 21, 2020, 4 pgs.

"Chinese Application Serial No. 202080027205.2, Office Action dated Apr. 15, 2022", with machine English translation, 15 pages.

"International Application Serial No. PCT US2020 027081, International Preliminary Report on Patentability dated Oct. 21, 2021", 6 pages.

"Chinese Application Serial No. 202080027205.2, Response filed Aug. 30, 2022 to Office Action dated Apr. 15, 2022", w English claims, 7 pgs.

* cited by examiner

COOLING FOR A PLASMA-BASED REACTOR

CLAIM OF PRIORITY

This application is a U.S. National Stage Filing under 35 U.S.C. 371 from International Application No. PCT/US2020/027081, filed on Apr. 7, 2020, and published as WO 2020/210240 A1 on Oct. 15, 2020, which claims the priority benefit to U.S. Patent Application Ser. No. 62/830,896, filed on 8 Apr. 2019, and entitled "COOLING FOR AN INDUCTIVE PLASMA-BASED REACTOR," each of which is incorporated by reference herein in its entirety.

TECHNICAL FIELD

The subject matter disclosed herein relates to various types of equipment used in the semiconductor and allied industries. More specifically, the disclosed subject matter relates to temperature control of a dielectric window of an inductive plasma-based reactor.

BACKGROUND

Plasma-based processing apparatuses are used to process substrates by techniques including etching, atomic-layer deposition (ALD), physical vapor deposition (PVD), chemical vapor deposition (CVD), ion implantation, resist removal, and other techniques known the art. One type of plasma-processing apparatus used in plasma processing includes an inductively-coupled plasma (ICP), or transformer-coupled plasma (TCP), chamber. Energy is supplied by electric currents that are produced by electromagnetic induction (by time-varying magnetic fields). A radio-frequency (RF) antenna in the form of one or more RF coils provides energy to excite a process gas in the chamber into a plasma state to process substrates (e.g., silicon wafers) in the chamber.

In ICP/TCP chambers, a dielectric (e.g., ceramic) window separates the chamber from the RF antenna or coils. However, the brittle nature of the dielectric window material poses a limitation to the RF power used because, as the RF power increases, heat flux into the dielectric window increases. The heat flux leads to temperature gradients within the window, which can cause internal stresses in the dielectric window. Also, the distribution of heat flux within the window can produce a highly non-uniform thermal distribution, which exacerbates the thermal stress problem.

As power applied to ICP/TCP chambers has increased, cooling of the dielectric window has become a significant concern. Currently, the dielectric windows are cooled using forced air. However, the complexity of a forced-air system has been increasing. Forced air is inexpensive but the air heated by the window usually cannot be rejected into a fabrication (fab) environment but must instead be delivered to a ventilation system. The forced air generally comprises compressed air that must be supplied to the window of the plasma-based processing apparatus at high volumes. A multiple-zone temperature control system is employed to maintain the window at a substantially consistent temperature. This control system is difficult to implement for various reasons: the large thermal masses involved, the slow response of the heating/cooling systems, and the nonlinearity inherent in 'on-off' control as is currently used for compressed-air cooling. The result of not adequately controlling each of these variables creates large thermal swings in the window temperature. One effect of the large thermal swings, in addition to increased stresses in the window, is an increase in particulate contamination on a substrate in the chamber due to mechanical rubbing of internal chamber components due to thermal expansion of the dielectric window relative to surrounding components and potential delamination of window coatings.

One approach used in high-density plasma CVD (HDPCVD) reactors is to flow a cooling liquid through plasma-excitation coils and bond these coils to the (in that case) dielectric dome of the HDPCVD reactor. Unfortunately, the demands of chamber-to-chamber uniformity, the split-coil design, and the need to refurbish and reinstall the dielectric window preclude this approach for contemporaneous ICP/TCP reactors.

In other attempted solutions to the window-heating problem, cooling-liquid channels are embedded in the dielectric window. However, experience gained by ICP/TCP manufacturers with electrostatic chuck (ESC design, which also rely on cooling-liquid channels, has shown that the design of such channels is complex. Using cooling-liquid channels means that the cooling liquid is heated as it passes through the window, thereby leading to thermal non-uniformity within the window. Further, a length of a required channel leads to a large depth of the channels if sufficient liquid is to be circulated to remove the heat. Such channels are both difficult to manufacture and weaken the dielectric window.

The information described in this section is provided to offer the skilled artisan a context for the following disclosed subject matter and should not be considered as admitted prior art.

DETAILED DESCRIPTION

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps, construction techniques, or structures have not been described in detail so as not to obscure the disclosed subject matter.

The disclosed subject matter uses concepts from both heat pipe and thermosyphon construction. Consequently, the terms "heat pipe" and "thermosyphon" may generally be considered synonymous and may therefore be used interchangeably herein, unless the context indicates otherwise.

As is known to a person of ordinary skill in the art, thermosyphon and heat pipe structures may be used to control temperature at a temperature determined by the vapor pressure of the working fluid (e.g., the heat-transfer fluid). Heat transport is accomplished via latent heat transfer. Interior surfaces of the thermosyphon may be considered to be approximately isothermal because of the strong dependence of vapor pressure, and hence evaporation (condensation) rate, of the working fluid. If the heat-transfer fluid is distributed on the heated surface in a thin layer (e.g., sufficiently thin to avoid significant bubble formation), a temperature of the heated surface will be highly uniform. An evaporation rate is high since the rate is a function of temperature. As the temperature increases, the evaporation rate increases substantially proportionately.

Various embodiments of a thermosyphon of the disclosed subject matter may be adapted to cool or heat a dielectric window of various types of an ICP/TCP plasma-based reaction chamber known in the art. As described herein, a condensing surface for the heat-transfer fluid (working fluid) comprises a conical structure above the dielectric window. A surface of the conical structure is maintained at or near a desired temperature of the dielectric window by the circulating heat-transfer fluid. In various embodiments, ICP/TCP heater coils are embedded inside the thermosyphon structure. The coils are exposed to the working fluid in order to have sufficient room for the thermosyphon structure. However, the coils restrict somewhat the choice of the fluid. For example, water is a good working fluid for thermosyphon structures because of its exceptional latent heat per unit volume. In some examples, water vapor may not be compatible with voltages that may be greater than 10 kV that are present near ICP/TCP coils.

Further, in certain applications and embodiments it may be desirable to avoid use of a flammable or toxic working fluid due to a (relatively small) possibility of a leak. As discussed in more detail below, a working fluid suitable for use in the approximately 120° C. temperature range encountered within the thermosyphon is a variety of perfluorinated or fluorocarbon-based heat-transfer fluids, widely used for cooling. These heat-transfer fluids can be formulated to have various boiling points (e.g., such as a boiling point of about 110° C.). Unfortunately, the latent heat per unit volume is less than about 10% of the latent heat of an equivalent volume of water. For example, calculations show that to remove approximately 5 kW from the window surface a volume flow of about 2.5 liters/minute is necessary. Because various embodiments of the thermosyphon assembly disclosed herein are generally large in physical dimensions, use of non-water-based heat-transfer fluids may be feasible if sufficient consideration is given to the design of structures that control return of condensate to the dielectric window.

Various embodiments of the disclosed subject matter provided herein use a closed-cycle thermosyphon to remove heat from the dielectric window. In various embodiments described herein, the thermosyphon may also be considered to be a type of heat pipe (as noted above, the two terms may be considered to be synonymous and may therefore be used interchangeably herein). Thermosyphons remove energy from heated surfaces via evaporation. Evaporated liquid is condensed at a separate location and recirculated to the cooled surface. If the heated surface can be made large and is located above the heated surface, the system, in certain embodiments, can be entirely passive. In other embodiments, the system may be assisted by fluid pumps and heat exchangers that are external to the thermosyphon environment (e.g., coiling coils formed on an exterior surface of the condensing structures). Temperature control is obtained by controlling the temperature of the cooled surface. Due to the highly nonlinear dependence of evaporation rate on temperature, areas of the heated surface with higher heat input are cooled more aggressively: thus, the system can lead to a much more uniform temperature across a large surface than can otherwise be obtained. Further, as described herein in various embodiments, the disclosed subject matter uses ICP/TCP coils that are embedded within the thermosyphon assembly and RF power is coupled through the walls of this assembly.

Figure 1:
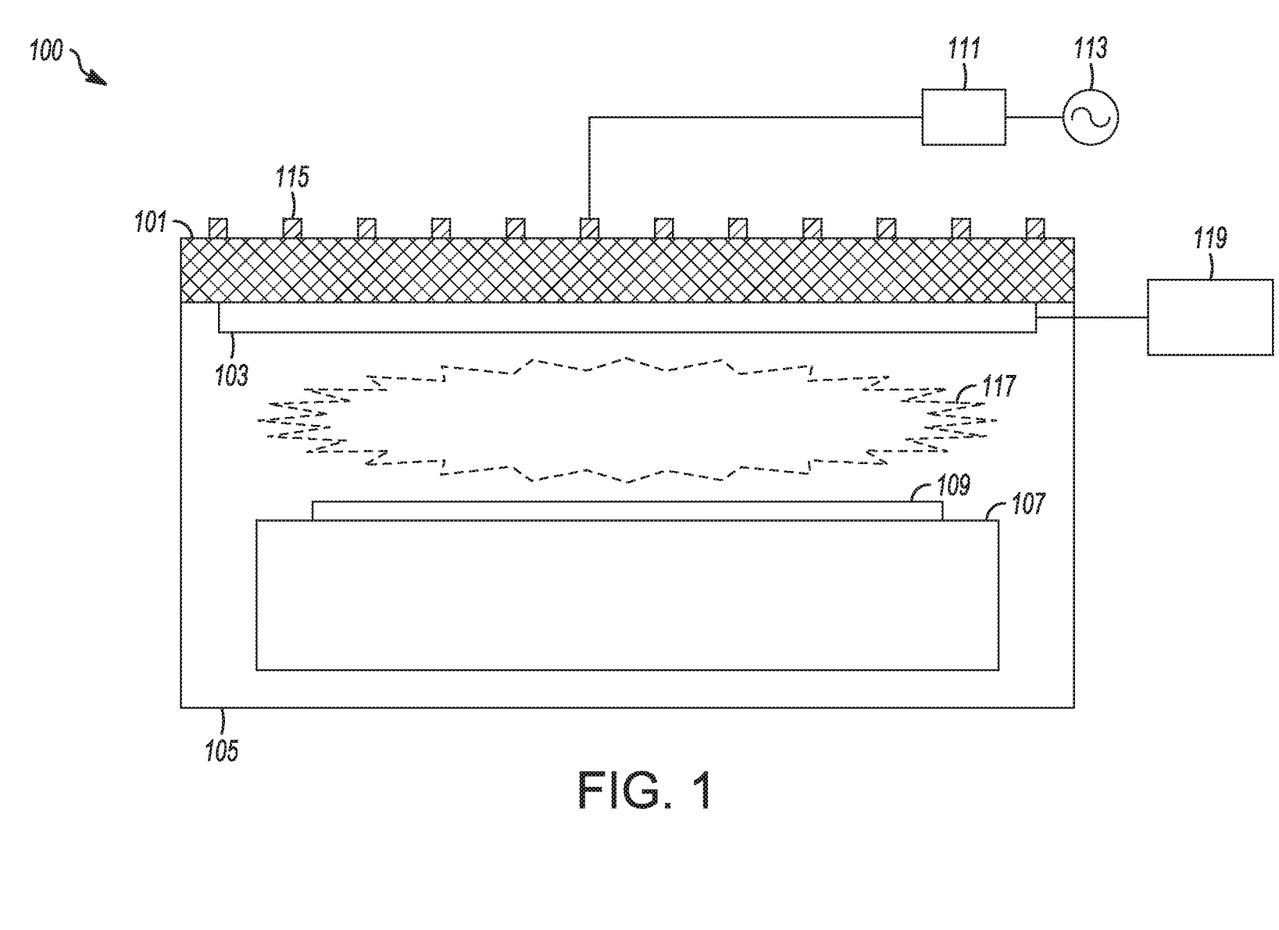
FIG. 1 shows an embodiment of a cross-sectional drawing of an ICP/TCP plasma-based processing apparatus.

With reference now to FIG. 1, an embodiment of a cross-sectional drawing of an inductively-coupled plasma/transformer-coupled plasma (ICP/TCP) processing apparatus 100 is shown. As is understood by a person of ordinary skill in the art, the ICP/TCP processing apparatus 100 can be used for depositing materials ALD, CVD, PECVD, and other techniques known in the art, as well as plasma etching of various materials on substrates. In general, a process gas is supplied into a vacuum chamber at a low pressure (e.g., below 10 mTorr) and an application of radio-frequency (RF) energy is supplied to the gas. Examples of ICP/TCP plasma-processing chamber include various deposition and etch systems. For example, suitable plasma-processing chambers include the Altus® family of deposition systems and the Kiyo® family of etch systems, both manufactured by Lam Research Corporation, 4650 Cushing Parkway, Fremont, Calif., USA.

The ICP/TCP processing apparatus 100 is shown to include a reaction chamber 105, a dielectric window 101, a gas-distribution device 103, an RF source 113, an RF impedance-matching circuitry 111, and RF coils 115 that supply RF energy to gases in the reaction chamber 105. Process gases are introduced into the reaction chamber 105 from a gas supply 119 (or multiple process-gas supplies) through the gas-distribution device 103. The gas-distribution device 103 may comprise a gas showerhead, a gas injector, or other suitable devices known in the art. The RF energy from the RF coils 115 is inductively coupled to the process gases through the dielectric window 101.

The dielectric window 101 is less likely to break given a substantially uniform temperature distribution across the window. The disclosed subject matter provides a heat pipe (thermosyphon) that, due the details provided herein, the interior portions of the heat pipe are at a fairly-uniform temperature. As defined herein, a heat pipe provides for a passive heat exchange within the heat pipe based on natural convection. Therefore, no mechanical devices within the heat pipe are used to induce forced convection after the dielectric window provides sufficient heat to produce natural convection within the heat pipe. However, according to the various embodiments, the liquid proceeds directly to a vapor phase without boiling. A flat plane of an uppermost surface of the dielectric window 101 provides a substantially flat plane on which evaporation may occur. Consequently, the heat pipe may be considered a loop-type heat pipe. In various embodiments, the heat pipe of the disclosed subject matter may be considered to be a sealed unit with the heat-transfer fluid contained within the sealed heat pipe.

The ICP/TCP processing apparatus 100 is further shown to include a substrate support 107 (e.g., an electrostatic chuck (ESC)) for supporting a substrate 109 (e.g., a silicon wafer) in an interior of the reaction chamber 105. Once one or more process gases are introduced into the interior of the reaction chamber 105 from the gas supply 119 through the gas-distribution device 103, the process gases are energized into a high-density plasma 117 by the RF coils 115 supplying energy inductively into the interior of the reaction chamber 105. In various embodiments, the RF coils 115 comprise an external planar antenna powered by the RF source 113 and the RF impedance-matching circuitry 111 to inductively couple RF energy into the reaction chamber 105. An electromagnetic field generated by the application of RF power to the RF coils (e.g., the planar antenna) energizes the one or more process gases to form the high-density plasma 117. In an exemplary embodiment, the high-density plasma 117 may comprise about $10^{10}$ to about $10^{12}$ ions/cm$^3$ formed substantially above the substrate 109.

With continuing reference to FIG. 1, the dielectric window 101 forms a top or uppermost wall of the reaction chamber 105. Several different types of window material may be used for the dielectric window 101, including ceramic, quartz, or glass materials. For example, various materials suitable for the dielectric window 101 may include aluminum oxide ($Al_2O_3$), zirconium oxide ($ZrO_2$), silicon dioxide ($SiO_2$), and other materials known in the art. The dielectric window 101 maintains isolation of the interior of the reaction chamber 105 from an outside environment (e.g., the fab), while allowing penetration of a magnetic field produced by the RF coils 115. The RF coils 115 can be disposed very close to, or touching, the dielectric window 101 in order to increase or maximize an intensity of the magnetic field produced within the reaction chamber 105. A thickness of the dielectric window 101 is selected to be thin enough to transmit RF energy from the RF coils 115 to the interior of the reaction chamber 105, thereby allowing formation of the high-density plasma 117. Conversely, the dielectric window 101 is selected to be sufficiently thick enough to withstand the differential pressure created between the vacuum created within the reaction chamber 105 and an outside environment. Based on a material selected to form the dielectric window 101 and physical distances over which the dielectric window 101 is to span, a person of ordinary skill in the art will recognize how to determine an appropriate thickness of the dielectric window 101.

Figure 2:
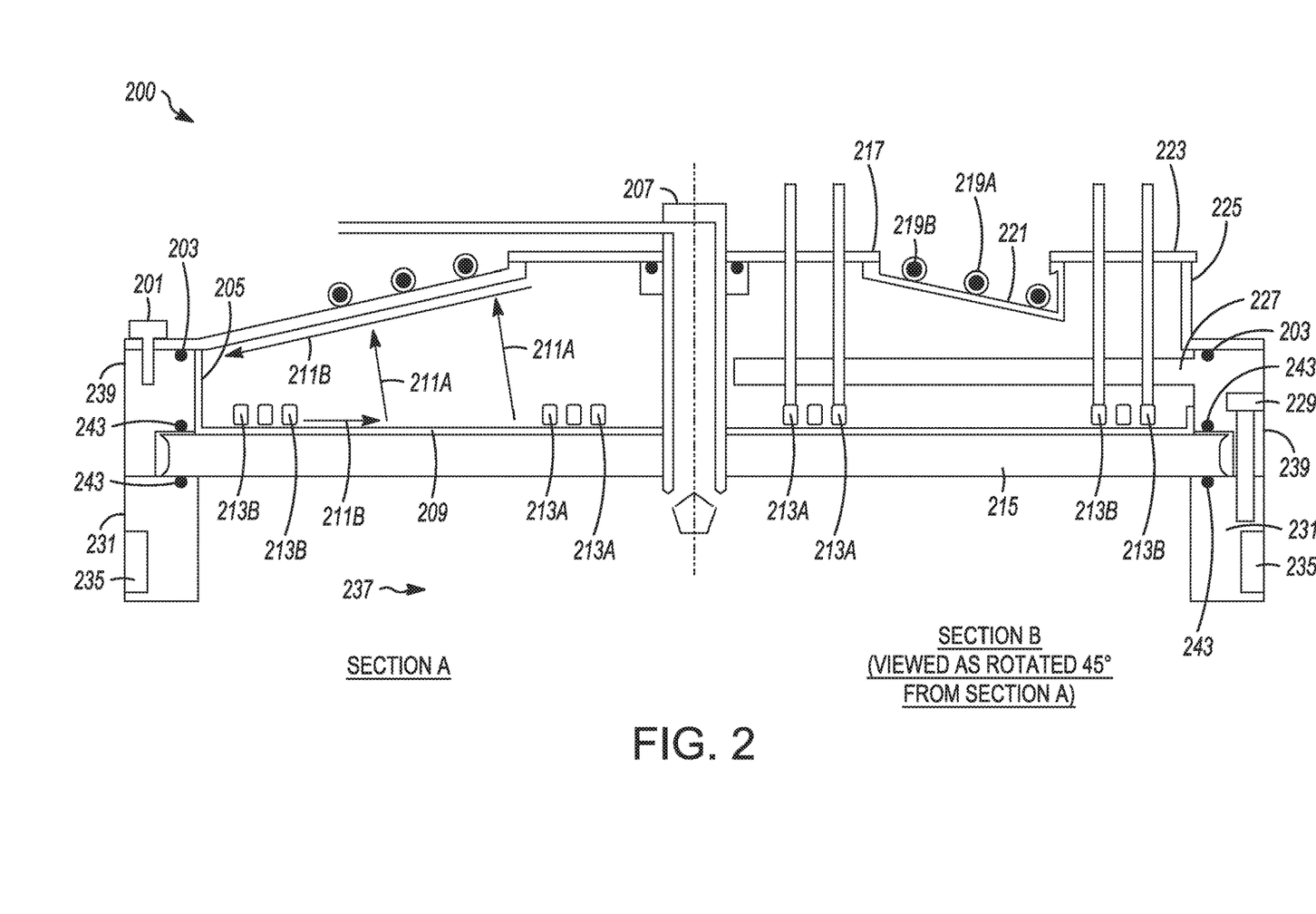
FIG. 2 shows a cross-sectional drawing of an embodiment of a heat-pipe cooling system in accordance with various embodiments.
Figure 3:
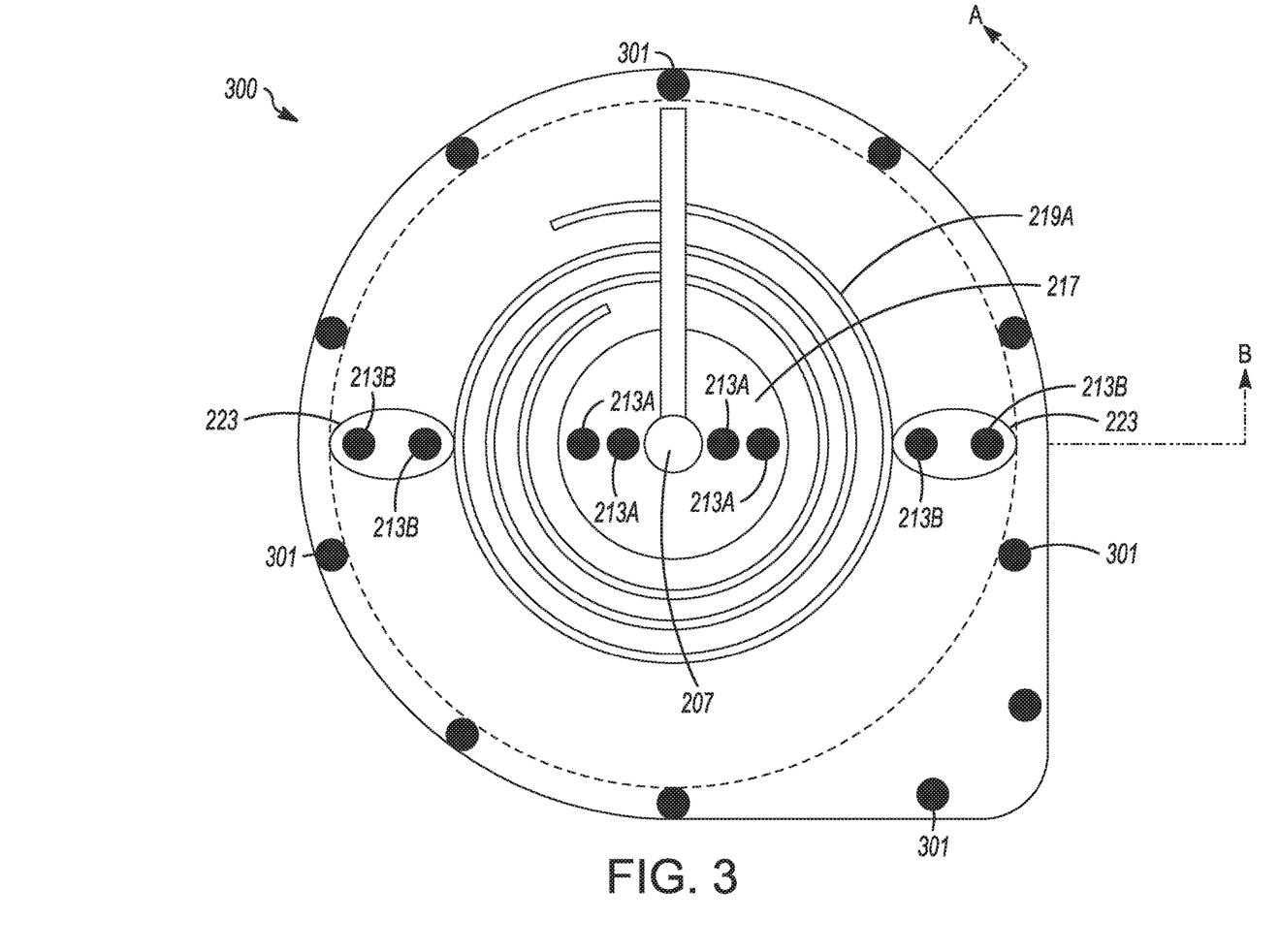
FIG. 3 shows a top view of the heat-pipe cooling system in accordance with FIG. 2.

FIG. 2 shows a cross-sectional drawing of an embodiment of a heat-pipe cooling system 200 in accordance with various embodiments. As noted in FIG. 2, the left-half portion of the drawing shows the cross-section with regard to Section A as indicated FIG. 3. The right-half portion of the drawing shows the cross-section with regard to Section B, also as indicated by FIG. 3. The heat-pipe cooling system 200 is shown to include a conical structure 221 that is truncated (therefore the conical structure forms a type of frustoconical structure, which generally has the shape of a frustum of a cone—the basal (lower) part of a cone formed by cutting off the top by a plane generally parallel to the base, as is understood in the art). The conical structure 221 includes a top insulating-plate 217 and at least one cooling coil 219A near or in contact with (e.g., in proximity to) an uppermost portion of the conical structure 221. The at least one cooling coil 219A contains a heat-transfer fluid 219B, which may be circulated within the cooling coil 219A by an external pump and routed through a heat-exchanger to cool the heat-transfer fluid 219B (neither the external pump or the heat exchanger mechanism are shown but the use of both devices in this application are understandable to a skilled artisan upon reading and understanding the disclosed subject matter). Generally, the cooling coil 219A and the heat-transfer fluid 219B may be maintained at or near a desired operating temperature of the dielectric window 215.

In certain embodiments, one or both of inner excitation-RF-antennas 213A and peripheral excitation-RF-antennas 213B may also be included and placed in proximity to a dielectric window 215. The inner excitation-RF-antennas 213A may be inserted through the top insulating-plate 217. The peripheral excitation-RF-antennas 213B may be inserted through a port 225 formed within a portion of the conical structure 221. The port 225 is capped with a port insulating-plate 223.

The conical structure 221 may be machined or otherwise formed from a variety of materials. In certain exemplary embodiments, the conical structure 221 may be formed from various types of metallic or otherwise thermally-conductive materials. These materials include, for example, copper and copper alloys (including zinc alloys (e.g., brass), aluminum and various types of aluminum alloys, or various grades of stainless steel (e.g., type 304 or 316L). In certain exemplary embodiments where the conical structure 221 may be in contact with corrosive gases or other liquids, the conical structure 221 may be formed from various types of high-performance alloys. Such high-performance alloys include, for example, Inconel® (available from different sources including Inco Alloys International, Inc., Huntington, W. Va., USA) or Hastelloy® (available from different source including Haynes Stellite Company, Kokomo, Ind., USA and Union Carbide Corporation, New York, N.Y., USA). In other exemplary embodiments, the conical structure 221 may be formed from various types of dielectric or polymeric materials. These materials include machinable and/or formable polymers and high-performance plastics (e.g., Delrin® or Kepital®, both of which are known in the art). However, in order to retain a relatively high level of thermal conductivity, the various dielectric or polymeric materials may be impregnated with, for example, carbon.

The top insulating-plate 217 and the port insulating-plate 223 may be at least partially formed of various types of thermally-insulating materials known in the art to retain heat within the heat-pipe cooling system 200. The thermally-insulating materials may include a material similar to or the same as materials used to form the conical structure 221, coupled with a thermally-insulating material known in the art. The insulating plates 217, 223 are fastened or otherwise adhered (e.g., by chemical adhesives, welding, or other techniques known in the art) to an uppermost portion of the conical structure 221 and the port 225, respectively. In particular embodiments for certain applications, the insulating plates 217, 223 may be formed entirely from a thermally non-insulating material.

Figure 6:
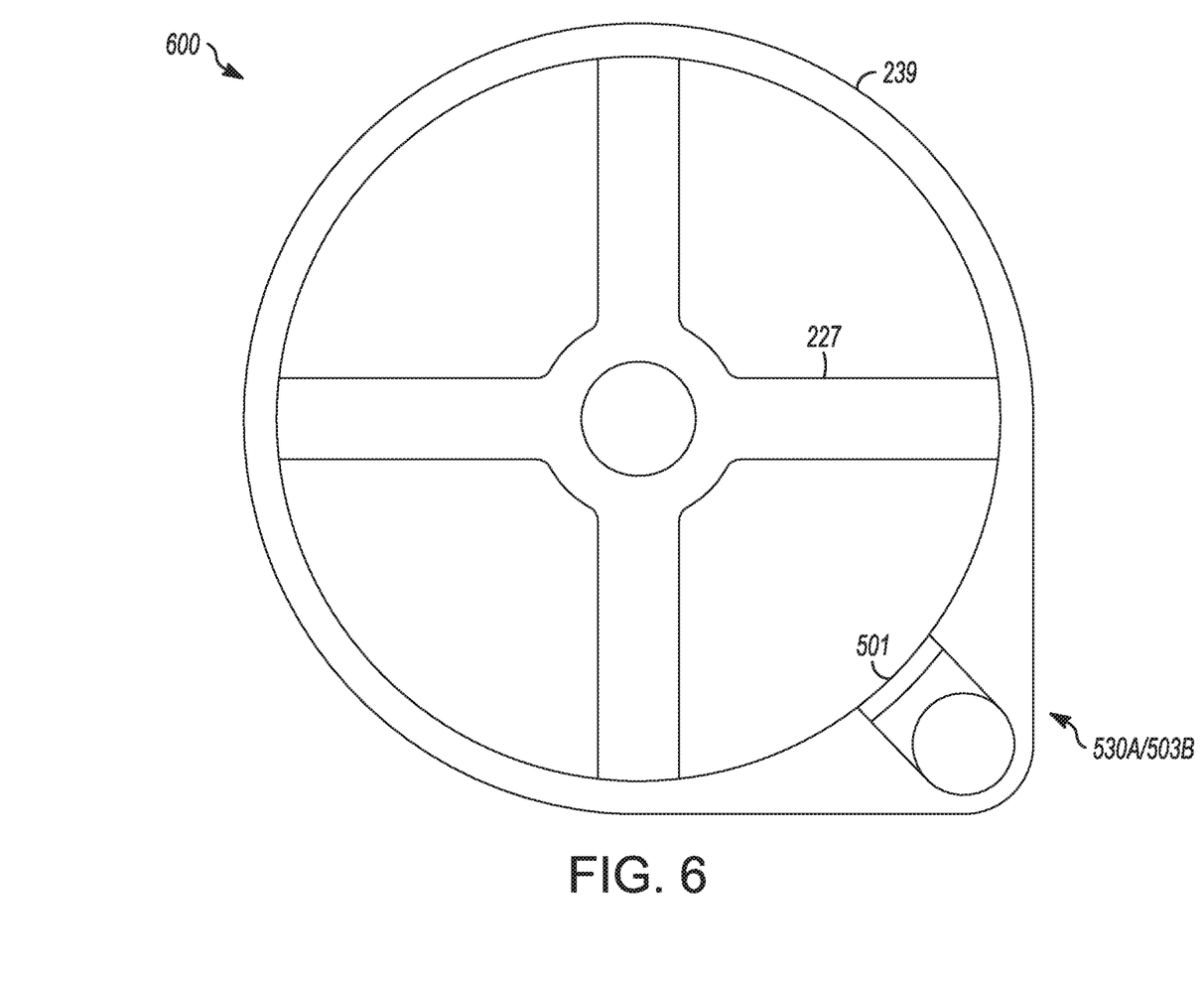
FIG. 6 shows an embodiment of a top view of an upper window-support structure and a coil-support ring in accordance with various embodiments.

With continuing reference to FIG. 2, and now to FIG. 6, both of the inner excitation-RF-antennas 213A and the peripheral excitation-RF-antennas 213B may be supported by a coil-support ring 227. The coil-support ring 227 may be machined or otherwise formed from a variety of materials known in the art such as ceramics or metals. A process-gas injector 207 may introduce one or more process gases into an interior portion 237 of a reaction chamber (such as the reaction chamber 105 of FIG. 1). Each of the inner excitation-RF-antennas 213A and the peripheral excitation-RF-antennas 213B, the dielectric window 215, and the process-gas injector 207 may be the same as or similar to the RF coils 115, the dielectric window 101, and the gas-distribution device 103, respectively, of FIG. 1. Although not shown explicitly, the process-gas injector 207 is sealed (to prevent vacuum release or leaking to an outside ambient environment) at both the top insulating-plate 217 and at the dielectric window 215.

The conical structure 221 is fastened to an upper window-support structure 239 by a plurality of fasteners 201 (e.g., machine screws, bolts, or other fasteners known in the art), only one of which is shown for clarity. Each of the plurality of fasteners is inserted through a plurality of corresponding through-holes in a bolt circle 301 (see FIG. 3). A sealant material 203 prevents a generated vacuum within the interior portion 237 of the reaction chamber from leaking between the upper window-support structure 239 and the conical structure 221. The sealant material 203 may comprise various types of metal seals known in the art, or O-ring seals (e.g., fabricated from Kalrez® or other types of perfluorinated elastomer or fluoroelastomer materials), may be used to prevent gas from leaking between the upper window-support structure 239 and the conical structure 221. In a specific exemplary embodiment, an integrity of the sealant material 203 may be checked for a helium leak-rate of about $10^{-9}$ Torr liter per second, maximum.

The upper window-support structure 239 is fastened to the lower window-support structure 231 by a plurality of fasteners 229 (e.g., machine screws, bolts, or other fasteners known in the art), only one of which is shown for clarity. A sealant material 243 prevents a generated vacuum within the interior portion 237 of the reaction chamber from leaking between the upper window-support structure 239 and the dielectric window 215, or between the dielectric window 215 and the lower window-support structure 231. The sealant material 243 may be the same as or similar to the sealant material 203 described above (e.g., a metal seal or an O-ring). In the various embodiments disclosed herein, the pressure range inside the heat-pipe cooling system 200 is considerable. Depending on the application, there must be little or no leaking at absolute pressures from approximately 20 Torr to 1500 Torr. Consequently, a person of ordinary skill in the art will recognize a need for the sealant materials 203, 243.

The lower window-support structure 231 also includes one or more channels 235 to provide thermal (heating or cooling) control as described herein. The channels 235 are formed by machining or other techniques known in the art within the lower window-support structure 231. Various types of heat-transfer fluid, described in more detail below, may be used and placed within the one or more channels 235. The channels 235 may be formed near an outer periphery of the lower window-support structure 231 or at any location chosen within the lower window-support structure 231. Additionally, the channels 235 may be formed continuously within the lower window-support structure 231 (e.g., as a toroidally-shaped channel) or in a plurality of segmented portions within the lower window-support structure 231. Therefore, in various embodiments, the lower window-support structure 231 may be formed from a material that has a high thermal-conductivity such that the heat-transfer fluid contained within the channels 235 may, by conductive cooling from the lower window-support structure 231 to the dielectric window 215, and by convective cooling from the lower window-support structure 231 to the heat-transfer fluid within the channels. In various embodiments, the fluid within the channels may be circulated by, for example, an external pump to provide additional convective cooling.

During operation of the heat-pipe cooling system 200, heat-transfer fluid placed within a space formed between the dielectric window 215 and the conical structure 221 is evaporated from an uppermost surface of the dielectric window 215. The heat-transfer fluid is then evaporated from the uppermost surface as a vapor 211A and is then condensed on a facing cooled-surface (the underside of the conical structure 221), thereby forming a heat-transfer fluid condensate 211B. In a specific exemplary embodiment, a heat-transfer liquid such as Galden® HT110 (available from Solvay Solexis, Inc., Thorofare, N.J., USA) may be used within the heat-pipe cooling system 200. Galden® is a dielectric fluid (at standard temperature and pressure) with selectable boiling points ranging from about 55° C. to about 270° C. The dielectric properties of perfluorinated polyethers (PFPE) within Galden®, as well as their chemical stability combined with the capacity to operate at very low as well as elevated temperatures, make Galden® a suitable heat-transfer fluid for conditions found in semiconductor and related industries. In another specific exemplary embodiment, another fluorocarbon-based heat-transfer fluid may be used instead of or in addition to Galden®. One such fluorocarbon-based heat-transfer fluid is Fluorinert® (available from the 3M Company, Maplewood, Minn., USA). Various formulations of Fluorinert® can be selected to have boiling points ranging from about 56° C. to about 215° C. Upon reading and understanding the disclosed subject matter, a person of ordinary skill in the art will recognize that a number of other heat-transfer fluids, which are capable of acting in a two-phase regime (e.g., liquid and vapor) to provide evaporative cooling as described herein, may be used as well.

Inner sidewalls of the upper window-support structure 239 may include a number of capillary grooves 205 machined, etched (e.g., chemically etched or laser-etched), or otherwise formed therein. The capillary grooves 205 provide a path to transport the heat-transfer fluid condensate 211B, formed on an interior portion of the conical structure 221, from the vapor 211A produced by heat of the dielectric window 215. An uppermost surface of the dielectric window 215 also includes a plurality of capillary grooves 209 and may also optionally include a wick structure comprising one or more types of liquid-wicking material such as a mesh material, a porous (or partially porous) sintered-powder, a sintered ceramic, a sintered polymer, or another capillary structure known in the art (the capillary tubes and the wicking material are not readily visible in FIG. 2, but are described in more detail with reference to FIGS. 4A through 4C, below).

Formation of the capillary grooves 209 may be the same as or similar to the capillary grooves 205 formed on the inner sidewalls of the upper window-support structure 239. However, the capillary grooves on the inner sidewalls of the upper window-support structure 239 are formed to be substantially vertically-oriented to increase the mass transport of the heat-transfer fluid back the uppermost portion of the dielectric window 215. The capillary grooves 209 continue to transport the heat-transfer fluid condensate 211B back across an uppermost portion of the dielectric window 215. Once the heat-transfer fluid condensate 211B receives sufficient heat from the dielectric window 215 to transform the condensate again to the vapor 211A phase, the entire thermodynamic cooling cycle begins again.

The wick structure therefore causes the heat-transfer fluid condensate 211B to drain and be distributed across an upper surface of the dielectric window 215. For cases where a heat load from the dielectric window 215 cannot maintain a temperature of the dielectric window 215, a heated sump (shown and described below, with reference to FIGS. 5A and 5B) is provided so that the vapor 211A and heat-transfer fluid condensate 2111B can be begin the two-phase thermodynamic cycle described above to cool the dielectric window 215.

Consequently, the heat-pipe cooling system 200 is therefore a heat-transfer device that combines the principles of both thermal conductivity and phase transition to transfer heat from the dielectric window 215 to the conical structure 221 that comprise two solid interfaces. The conical structure 221, in turn, is further cooled by the cooling coil 219A and the heat-transfer fluid 219B contained therein. At the hot interface of the heat pipe (the dielectric window 215), the heat-transfer fluid condensate 211B in contact with the thermally conductive solid surface turns into the vapor 211A by absorbing heat from an uppermost surface of the dielectric window 215. The vapor 211A then travels to the cold-interface portion of the heat pipe (the conical structure 221) and condenses back into a liquid, thereby releasing the latent heat that was gained from contact with the dielectric window 215. The liquid then returns to the hot interface (the dielectric window 215) through, for example, a combination of capillary action (the capillary grooves 205) and gravity, and the thermodynamic cycle repeats. In various embodiments, and depending at least partially on the physical characteristics of a selected heat-transfer fluid, as well as an overall physical size of the heat-pipe cooling system 200, greater than 1 liter per minute (lpm) of fluid can be evaporated and then condensed to restart the cycle.

FIG. 3 shows a top view 300 of the heat-pipe cooling system 200 in accordance with FIG. 2. The top view 300 therefore supplements FIG. 2 as providing additional detail of an exemplary arrangement of components in the heat-pipe cooling system 200. Upon reading and understanding the disclosed subject matter, a person of ordinary skill in the art will recognize that additional or varied arrangements of the components may be realized and still be within a scope of the disclosed subject matter.

Figure 4A:
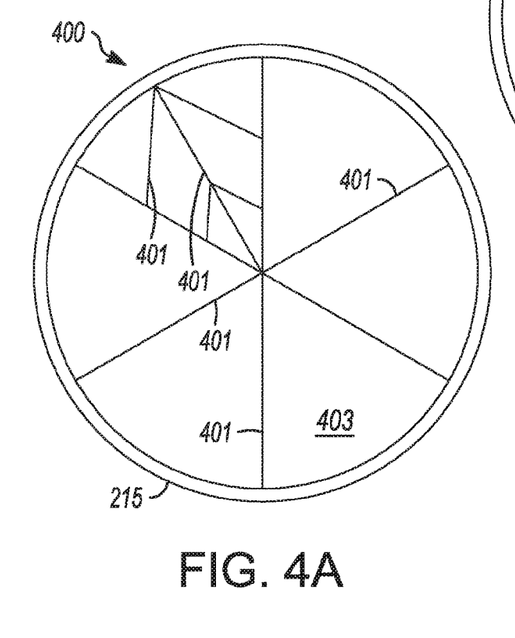
FIGS. 4A through 4C show various exemplary embodiments of coolant-distribution channels on a dielectric window.
Figure 4B:
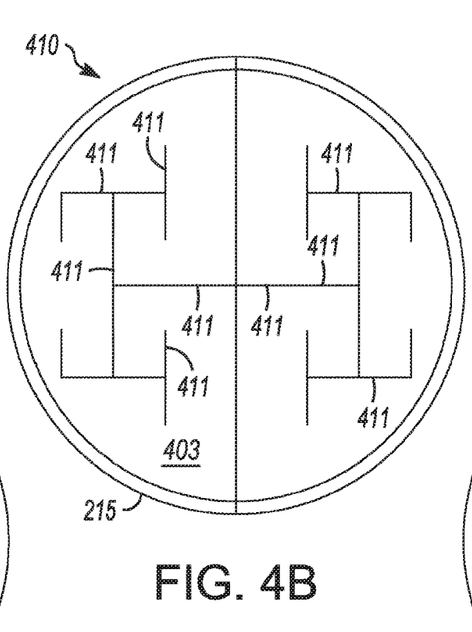
Figure 4C:
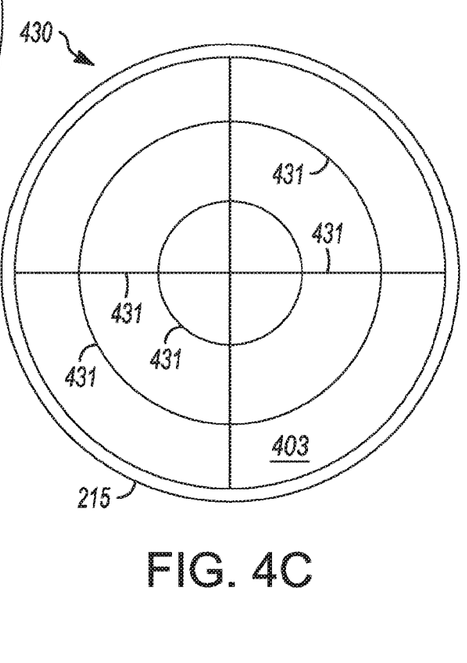

FIGS. 4A through 4C show various exemplary embodiments of coolant-distribution channels. In each of FIGS. 4A through 4C, a wick structure consisting of grooves, a mesh material, a porous sintered-powder, or another capillary structure is formed on an uppermost surface 403 of the dielectric window 215. In various embodiments, a combination of grooves and a porous sintered structure may be used in conjunction for an enhanced distribution of condensate. For example, a first pattern 400 of grooves 401, a second pattern 410 of grooves 411, and a third pattern 430 of grooves 431 are shown in FIGS. 4A, 4B, and 4C, respectively. With concurrent reference to FIGS. 4A through 4C and FIG. 2, each of these patterns is arranged to allow the heat-transfer fluid condensate 211B from the capillary grooves 205 on an outer periphery of an interior of the upper window-support structure 239 (see FIG. 2) to flow across the uppermost surface 403 of the dielectric window 215, thereby transferring heat from the dielectric window 215 to the heat-transfer fluid. Once sufficient heat is transferred into the heat-transfer fluid, the fluid is then evaporated from the uppermost surface 403 of the dielectric window 215 and transforms thermodynamic states from a liquid to the vapor 211A.

Upon reading and understanding the disclosed subject matter, a person of ordinary skill in the art will recognize how to determine a physical dimension (e.g., how deep and wide the grooves 401, 411, 431 should be) based on a volume of condensate flowing through the grooves 401, 411, 431, an amount of heat to be transferred to the fluid (condensate), a heat capacity of the liquid, a thickness of the dielectric window 215, and other factors known in the art.

Also, the skilled artisan will recognize a number of other patterns in which the grooves 401, 411, 431 may be formed.

Figure 5A:
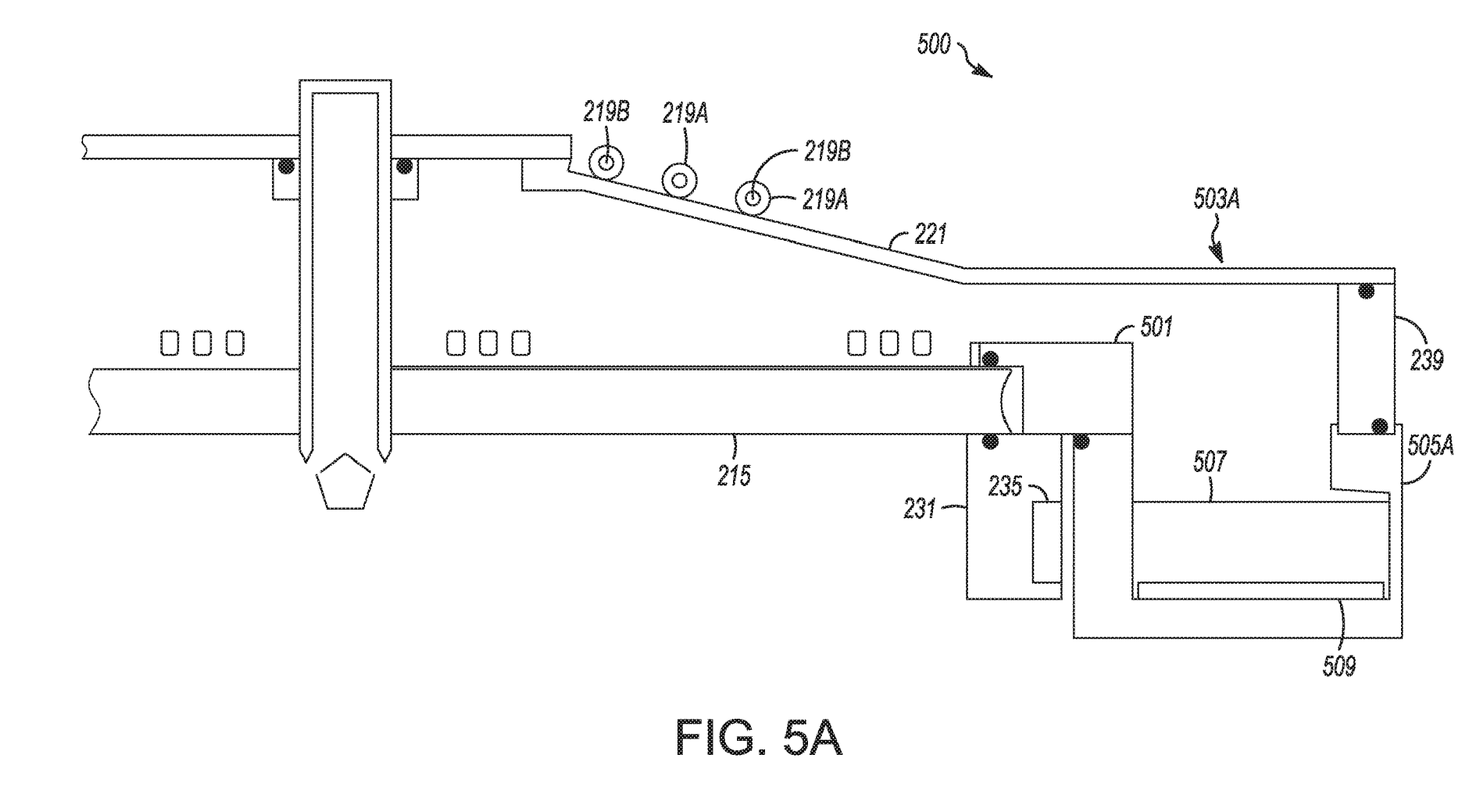
FIG. 5A shows an embodiment of a coolant preheater in accordance with various embodiments.

With reference now to FIG. 5A, an embodiment of a coolant preheater 500 in accordance with various embodiments of the disclosed subject matter is shown. The upper window-support structure 239 and the conical structure 221 are shown to include a reservoir/heater portion 503A, which extends beyond the dielectric window 215. A sump containment portion 505A is formed below an underside of the upper window-support structure 239, and outside a diameter of the dielectric window 215 (see also FIG. 6). A weir structure 501 allows liquid to flow into the sump containment portion 505A if the liquid exceeds a predetermined depth above the dielectric window 215. The coolant vapor-cycle described above functions when the dielectric window 215 is heated due to a plasma reaction within the interior portion 237 of the reaction chamber 105 (see FIG. 1). However, when the dielectric window 215 is relatively cool (e.g., upon a plasma startup, such as after system maintenance or upon tool startup), such that the dielectric window 215 cannot provide sufficient heat to bring the heat-transfer fluid to a vapor state as described above, a separate heater may be used. Therefore, the dielectric window 215 may be cold and the conical structure 221 (the condensing structure) may be at a higher temperature than the dielectric window 215. In this situation, heat will not then flow effectively to or from the dielectric window 215. In such cases, the disclosed subject matter may include features to allow heat to be provided externally as is described in more detail below.

With continuing reference to FIG. 5A, a heat-transfer fluid 507 in the sump containment portion 505A may be heated. For example, an electrical-heater element 509 may be used to provide an initial level of heat to the heat-transfer fluid 507 when the dielectric window 215 is cool. The heat-transfer fluid 507 may be the same as or similar to the heat-transfer fluid carried within the channels 235, as described above.

The weir structure 501 allows liquid that condenses on the dielectric window 215 to overflow into the sump containment portion 505A. The amount of liquid in the thermosyphon system is controlled so that when the heat-pipe cooling system 200 (see FIG. 2) is at its initial temperature, with essentially all the heat-transfer fluid (working fluid) in a liquid state, the sump containment portion 505A will at least partially fill. The sump containment portion 505A can then be heated, as described above, with, for example, the electrical-heater element 509.

Figure 5B:
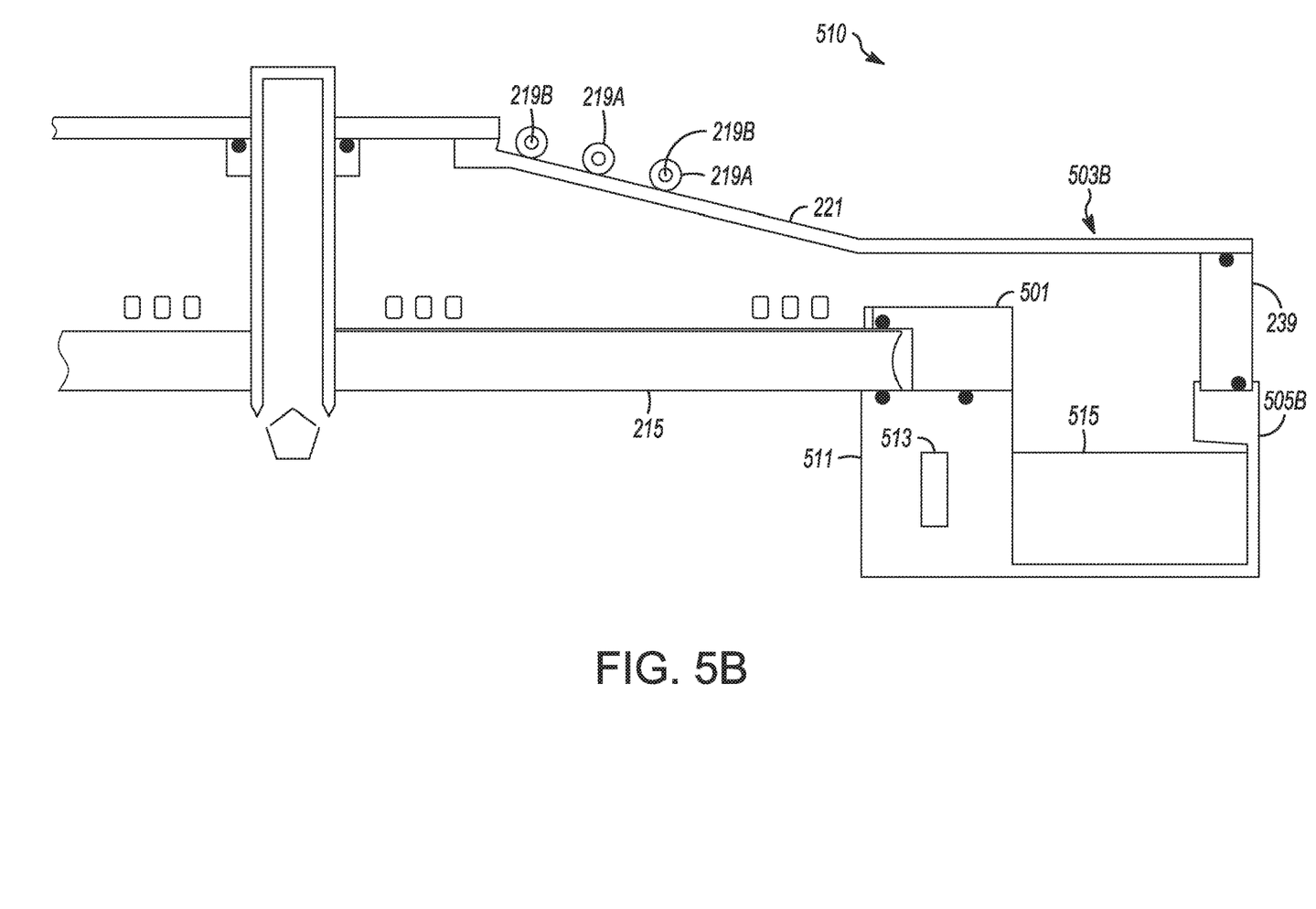
FIG. 5B shows another embodiment of a coolant preheater incorporated in an upper chamber in accordance with various embodiments.

FIG. 5B shows another embodiment of a coolant preheater 510 incorporated in an upper chamber in accordance with various embodiments of the disclosed subject matter. As with FIG. 5A, described above, the upper window-support structure 239 and the conical structure 221 are shown to include a reservoir/heater portion 503B, which extends beyond the dielectric window 215 (see also FIG. 6). A sump containment portion 505B is formed below an underside of the upper window-support structure 239, and outside a diameter of the dielectric window 215. Similar to the description provided above with reference to FIG. 5A, the weir structure 501 allows liquid to flow into the sump containment portion 505B if the liquid exceeds a predetermined depth above the dielectric window 215. Heat-transfer fluid 515 in this case may be heated by a temperature-controlled block 511 surrounding a channel 513.

The temperature-controlled block 511 may be coupled to an external temperature controller (not shown). Heat supplied to the external temperature controller may at least partially be heated by a number of heating schemes known in the art, such as reusing heat rejected from various pieces of equipment in a fabrication facility and dumped to facility cooling. Upon reading and understanding the disclosed subject matter, a person of ordinary skill in the art will recognize a number of other schemes to provide heat to the temperature-controlled block 511.

The channel 513 may be filled, or at least partially filled, with any of the heat-transfer fluids described herein or otherwise known in the art. The heat-transfer fluid 515 may be the same as, or similar to, the heat-transfer fluid contained within the channel 513. Both the channel 513 and the heat-transfer fluid 515 may then be heated by the temperature-controlled block 511 to provide sufficient heat to the heat-pipe cooling system 200 (see FIG. 2) to begin the two-phase thermodynamic cycle described herein.

With regard to both FIGS. 5A and 5B, in alternative or additional embodiments, after the dielectric window 215 has been heated (e.g., due to a plasma-processing reaction occurring), the heat-transfer fluid that is used to remove heat from an upper portion of the heat-pipe cooling system 200 can be used to heat the sump containment portion 505A, 505B, or a combination of both methods of FIG. 5A and FIG. 5B can be used. When the sump containment portion 505A, 505B is heated, vapor will condense on a surface of the dielectric window 215, thereby again starting a flow of liquid over the weir structure 501 and back into the sump containment portion 505A, 505B. This circulation of liquid will, if the heat input is sufficient, lead to the heat-pipe cooling system 200 (see FIG. 2) reaching an isothermal state with a temperature approximately equal to that of the conical structure 221.

FIGS. 5A and 5B describe only two methods that allow a temperature of heat-transfer fluid used with the dielectric window 215 to be raised to a sufficient heat level to begin the thermodynamic processes described herein. However, upon reading and understanding the disclosed subject matter, a person of ordinary skill in the art will recognize other ways of heating the dielectric window 215 from a cooled state in order to begin the two-phase process described herein. The other means of heating the heat-transfer fluid used with the dielectric window 215 are therefore considered to be within a scope of the disclosed subject matter.

FIG. 6 shows an embodiment of a top view 600 of the upper window-support structure 239 and the coil-support ring 227 in accordance with various embodiments. FIG. 6 has been described in detail above with regard to FIG. 2, FIG. 5A, and FIG. 5B. The top view 600 of FIG. 6 therefore supplies additional details for these figures as well as providing additional information for a person of ordinary skill in the art.

Overall, the disclosed subject matter contained herein describes or relates generally to the heat-pipe cooling system that is operable with and can be used to cool portions of tools in a semiconductor fabrication environment (fab). Such tools can include various types of deposition (including plasma-based tools such as atomic-layer deposition (ALD), chemical vapor deposition (CVD), plasma-enhanced CVD (PECVD), etc.) and etching tools (e.g., reactive-ion etching (RI E) tools). Therefore, in various embodiments, the disclosed subject matter relates to a thermal-management system to cool a plasma-based reactor. The disclosed subject matter may also be used with various types of thermal furnaces (e.g., such as rapid thermal annealing and oxidation), ion implantation, and a variety of other process and metrology tools found in various fabs and known to a person of ordinary skill in the art. However, the disclosed subject matter is not limited to semiconductor environments and can be used in a number of machine-tool environments such as cooling operations in robotic assembly, manufacturing, and machining environments (e.g., including those operations using physical vapor deposition (PVD tools)), as well as a variety of other environments. Upon reading and understanding the disclosure provided herein, a person of ordinary skill in the art will recognize that various embodiments of the disclosed subject matter may be used with other types of process tools as well as a wide variety of other tools, equipment, and components.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various configurations.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Further, functionally equivalent methods and devices within the scope of the disclosure, in addition to those enumerated herein, will be apparent to the skilled artisan from the foregoing descriptions. Portions and features of some embodiments, materials, and construction techniques may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

Examples

In a first example, the disclosed subject matter is a heat-pipe cooling system that includes a conical structure having an upper portion that is truncated. The conical structure is disposed above a dielectric window. The conical structure condenses vapor from a first heat-transfer fluid formed within a volume between the dielectric window and the conical structure. At least one cooling coil is formed proximate to an exterior portion of the conical structure.

The at least one cooling coil of the first example is to transport a second heat-transfer fluid therein.

In any of the previous examples, during an operation in which the dielectric window is heated, the first heat-transfer fluid is to receive sufficient heat from the dielectric window to transform the first heat-transfer fluid from a liquid phase into a vapor phase, and, after contact with the conical structure, the vapor phase is to form a condensate from the condensed vapor.

In any of the previous examples, the at least one cooling coil is formed proximate to the exterior portion of the conical structure and is in direct thermal contact with the exterior portion of the conical structure.

In any of the previous examples, the first heat-transfer fluid is a dielectric fluid having a selectable boiling-point and is capable of acting in a two-phase regime, including a liquid-phase regime and a vapor-phase regime, to provide evaporative cooling of the dielectric window.

In the previous example, the selectable boiling-point is selectable within a range from about 55° C. to about 270° C. at a pressure within the volume between the dielectric window and the conical structure.

In any of the previous examples, the heat-pipe cooling system includes an upper window-support structure that is mechanically coupled to respective outer peripheries of both the conical structure and the dielectric window.

In the previous example, capillary grooves are formed on an outer periphery of an interior of the upper window-support structure to flow the first heat-transfer fluid across an uppermost surface of the dielectric window.

In any of the previous examples, an uppermost surface of the dielectric window includes a number of capillary grooves in which the first heat-transfer fluid is to flow.

In any of the previous examples, an uppermost surface of the dielectric window includes a wick structure comprising one or more types of liquid-wicking materials including one or more materials selected from materials including a mesh material, an at least partially-porous sintered-powder, a sintered ceramic, and a sintered polymer.

In any of the previous examples, the heat-pipe cooling system includes a sump that can be heated. The sump is formed proximate to the dielectric window to initiate a two-phase thermodynamic cycle of the first heat-transfer fluid.

In the previous example, the heat-pipe cooling system includes a weir structure to allow liquid from the first heat-transfer fluid to flow into the sump if the liquid exceeds a predetermined depth above the dielectric window.

In any of the previous examples, the first heat-transfer fluid is to be distributed on the dielectric window in a layer sufficiently thin to reduce bubble formation within the first heat-transfer fluid.

In another example, the disclosed subject matter is a thermal-management system to remove heat from at least some components in a plasma-based reactor. The thermal-management system includes a conical structure to be disposed above a dielectric window. The conical structure is arranged to condense vapor from a first heat-transfer fluid placed within a volume between the dielectric window and the conical structure. An interior surface of the conical structure has a downward slope from a central portion of the conical structure towards an outer periphery of the conical structure. At least one cooling coil is formed proximate to the conical structure. The at least one cooling coil is arranged to transport a second heat-transfer fluid therein.

In another example of the thermal-management system, the conical structure includes an upper portion that is truncated, thereby forming a type of frustoconical structure. The upper portion is located near the central portion of the conical structure.

In any of the previous examples of the thermal-management system, during an operation of the plasma-based reactor, the first heat-transfer fluid is to receive sufficient heat from the dielectric window to transform the first heat-transfer fluid from a liquid phase into a vapor phase. After contact with the conical structure, the vapor phase is to form a condensate from the condensed vapor.

In any of the previous examples of the thermal-management system, the at least one cooling coil is formed on an exterior portion of the conical structure and is in direct thermal contact with the exterior portion of the conical structure.

In any of the previous examples of the thermal-management system, the second heat-transfer fluid is circulated within the at least one cooling coil by an external pump.

In any of the previous examples of the thermal-management system, the conical structure is formed from one or more thermally-conductive materials including at least one material selected from materials including copper, copper alloys, zinc alloys, aluminum, aluminum alloys, stainless steel, and high-performance alloys.

In any of the previous examples of the thermal-management system, the conical structure is formed from one or more thermally-conductive materials including at least one material selected from materials including carbon-impregnated dielectric materials and carbon-impregnated polymeric materials.

In any of the previous examples of the thermal-management system, an uppermost surface of the dielectric window includes a plurality of capillary grooves in which the first heat-transfer fluid is to flow.

In any of the previous examples of the thermal-management system, the system includes a sump that can be heated. The sump is proximate to the dielectric window. The sump is to initiate a two-phase thermodynamic cycle of the first heat-transfer fluid.

In any of the previous examples of the thermal-management system, the system includes a weir structure to allow liquid from the first heat-transfer fluid to flow into the sump if the liquid exceeds a predetermined depth above the dielectric window.

In another example, the disclosed subject matter is a thermosyphon to remove heat from a dielectric window in a plasma-based reactor. The thermosyphon includes a conical structure to be disposed above the dielectric window. The conical structure is arranged to condense vapor from a first heat-transfer fluid placed within a volume between the dielectric window and the conical structure. An interior surface of the conical structure has a downward slope from a central portion of the conical structure towards an outer periphery of the conical structure. The system also includes at least one cooling coil formed on the conical structure. The at least one cooling coil is arranged to transport a second heat-transfer fluid therein A sump, which is arranged to be heated, is formed proximate to and below the dielectric window to initiate a two-phase thermodynamic cycle of the first heat-transfer fluid.

In another example of the thermosyphon, a weir structure is included to allow liquid from the first heat-transfer fluid to flow into the sump if the liquid exceeds a predetermined depth above the dielectric window.

In any of the previous examples of the thermosyphon, an uppermost surface of the dielectric window includes a plurality of capillary grooves in which the first heat-transfer fluid is to flow.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A heat-pipe cooling system, comprising:
   a conical structure having an upper portion that is truncated, the conical structure configured to be disposed above a dielectric window, the conical structure being configured to condense vapor from a first heat-transfer fluid formed within a volume between the dielectric window and the conical structure, the first heat-transfer fluid is configured to receive sufficient heat from the dielectric window to transform the first heat-transfer fluid from a liquid phase into a vapor phase without boiling, and, after contact with the conical structure, the vapor phase is to form a condensate from the condensed vapor; and
   at least one cooling coil formed proximate to an exterior portion of the conical structure.

2. The heat-pipe cooling system of claim 1, wherein the at least one cooling coil is configured to transport a second heat-transfer fluid therein.

3. The heat-pipe cooling system of claim 1, wherein the first heat-transfer fluid is configured to receive sufficient heat from the dielectric window to transform the first heat-transfer fluid from a liquid phase into a vapor phase during an operation in which the dielectric window is heated.

4. The heat-pipe cooling system of claim 1, wherein the at least one cooling coil formed proximate to the exterior portion of the conical structure is in direct thermal contact with the exterior portion of the conical structure.

5. The heat-pipe cooling system of claim 1, wherein the first heat-transfer fluid is a dielectric fluid having a selectable boiling-point and is capable of acting in a two-phase regime, including a liquid-phase regime and a vapor-phase regime, to provide evaporative cooling of the dielectric window.

6. The heat-pipe cooling system of claim 5, wherein the selectable boiling-point is selectable within a range from about 55° C. to about 270° C. at a pressure within the volume between the dielectric window and the conical structure.

7. The heat-pipe cooling system of claim 1, further comprising an upper window-support structure mechanically coupled to respective outer peripheries of both the conical structure and the dielectric window.

8. The heat-pipe cooling system of claim 7, wherein capillary grooves are formed on an outer periphery of an interior of the upper window-support structure and configured to flow the first heat-transfer fluid across an uppermost surface of the dielectric window.

9. The heat-pipe cooling system of claim 1, wherein an uppermost surface of the dielectric window includes a plurality of capillary grooves in which the first heat-transfer fluid is to flow.

10. The heat-pipe cooling system of claim 1, wherein an uppermost surface of the dielectric window includes a wick structure comprising one or more types of liquid-wicking materials including one or more materials selected from materials including a mesh material, an at least partially-porous sintered-powder, a sintered ceramic, and a sintered polymer.

11. The heat-pipe cooling system of claim 1, further comprising a sump configured to be heated, the sump formed proximate to the dielectric window to initiate a two-phase thermodynamic cycle of the first heat transfer fluid.

12. The heat-pipe cooling system of claim 11, further comprising a weir structure to allow liquid from the first heat-transfer fluid to flow into the sump if the liquid exceeds a predetermined depth above the dielectric window.

13. The heat-pipe cooling system of claim 1, wherein the first heat-transfer fluid is to be distributed on the dielectric window in a layer sufficiently thin to reduce bubble formation within the first heat-transfer fluid.

\* \* \* \* \*